United States Patent
Nguyen et al.

(10) Patent No.: US 6,595,699 B1
(45) Date of Patent: Jul. 22, 2003

(54) OPTOELECTRONIC PACKAGE WITH CONTROLLED FIBER STANDOFF

(75) Inventors: Luu Thanh Nguyen, Sunnyvale, CA (US); Ken Pham, San Jose, CA (US); Peter Deane, Los Altos, CA (US); William Paul Mazotti, San Martin, CA (US); Bruce Carlton Roberts, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 58 days.

(21) Appl. No.: 09/922,946

(22) Filed: Aug. 3, 2001

(51) Int. Cl.[7] .................................................. G02B 6/36
(52) U.S. Cl. .............................. 385/88; 385/89; 385/90; 385/92; 385/14
(58) Field of Search ............................. 385/88, 94, 89, 385/90, 91, 92, 93, 14

(56) References Cited

U.S. PATENT DOCUMENTS

| | | | | |
|---|---|---|---|---|
| 4,222,629 A | * | 9/1980 | Dassele et al. ................. | 385/94 |
| 4,241,978 A | * | 12/1980 | Dubois et al. ................. | 385/31 |
| 4,346,294 A | * | 8/1982 | Albaugh et al. ......... | 250/227.24 |
| 4,927,228 A | * | 5/1990 | Van De Pas .................. | 385/90 |
| 4,979,791 A | * | 12/1990 | Bowen et al. ................. | 385/33 |
| 5,386,488 A | * | 1/1995 | Oikawa ........................ | 385/92 |
| 5,499,312 A | * | 3/1996 | Hahn et al. ................... | 385/91 |
| 5,515,468 A | * | 5/1996 | DeAndrea et al. ............ | 385/88 |
| 5,631,987 A | * | 5/1997 | Lasky et al. .................. | 385/88 |
| 5,857,050 A | * | 1/1999 | Jiang et al. ................... | 385/92 |

* cited by examiner

Primary Examiner—Brian Healy
(74) Attorney, Agent, or Firm—Beyer Weaver & Thomas, LLP

(57) ABSTRACT

An optoelectronic component is described that includes a photonic device carried by a substrate. A support structure having a relatively higher portion and a relatively lower portion is formed on or attached to the substrate. In a preferred embodiment, the support structure is a dam structure formed by dispensing a flowable material onto the substrate and hardening the dispensed material. The optoelectronic component further includes one or more optical fibers, with each optical fiber being in optical communication with an active facet on the photonic device. The relatively higher and lower portions of the support structure are arranged to position the optical fiber(s) at a desired standoff distance from the photonic device and to slightly incline the distal tip of each optical fiber relative to the top surface of the photonic device. The described packaging approach can be used in both single fiber and multi-channel devices. In some specific embodiments, the support structure is arranged to engage a fiber termination that holds the optical fiber(s). An optically clear cap may also be provided to cover the active facet of the photonic device. In embodiments where the support structure surrounds the photonic device, the support structure may be used as a containment for the cap. With this arrangement, a flowable clear topping material is dispensed over the photonic device without requiring a traditional molding operation.

25 Claims, 4 Drawing Sheets

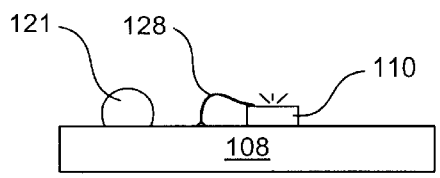
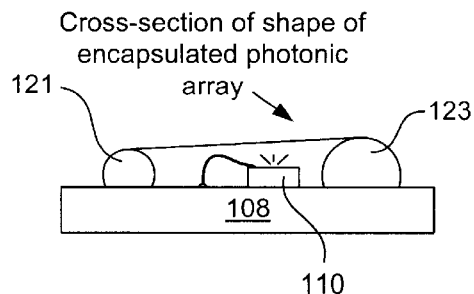
FIG. 5(a)　　　　　FIG. 5(b)
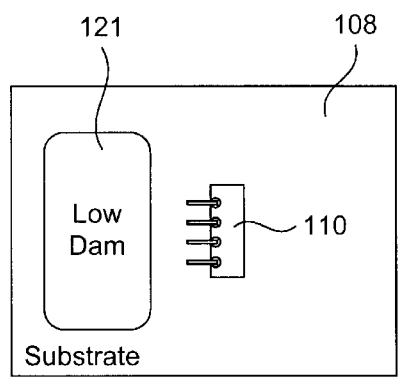
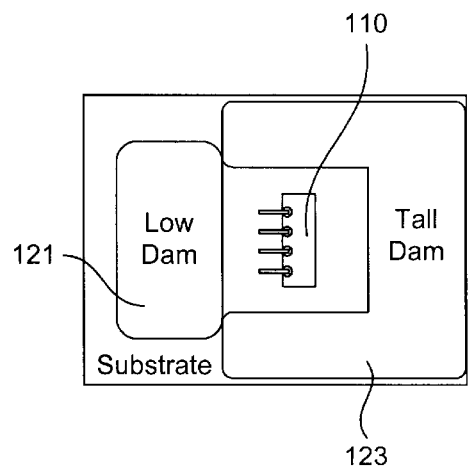
FIG. 5(c)　　　　　FIG. 5(d)
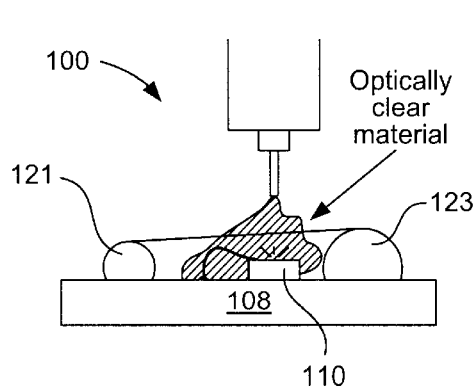
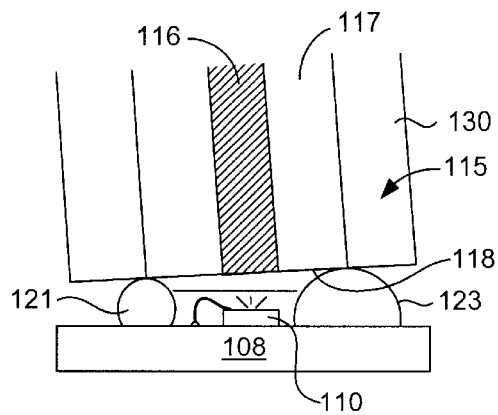
FIG. 5(e)　　　　　FIG. 5(f)

OPTOELECTRONIC PACKAGE WITH CONTROLLED FIBER STANDOFF

CROSS REFERENCE TO RELATED APPLICATIONS

The present application is related to concurrently filed, application Ser. Nos. 09/922,357 filed Aug. 3, 2001, pending Ser. No. 09/957,936 filed Sep. 21, 2001 pending, and Ser. No. 10/165,553 filed Jun. 5, 2002, pending, each of which are incorporated herein by reference.

FIELD OF THE INVENTION

The present inventions relate generally to mechanisms for controlling the interface between an optical fiber and a photonic device in an optoelectronic package. More particularly, a tapered dam structure that defines the relative positioning between the photonic device and the optical fiber(s) and is described. The dam structure may also be used to help contain a clear molding material that seals and protects the photonic device.

BACKGROUND OF THE INVENTION

Optical networks have a wide variety of applications and are, for example, widely used within the telecommunications, data transmission and high speed networking industries. The optical devices used to convert electrical signals into light signals and light signals into electrical signals are key components in any such optical network. Generally, such devices include one or more photonic elements (e.g. detectors and/or laser emitters) together with the electronic circuitry necessary to drive the photonic elements (e.g., receiver, transmitter or transceiver circuitry). Although a wide variety of optical transceiver devices are currently commercially available, there are always continuing efforts to improve their design and functionality as well as to lower their production costs.

At the time of this writing, most commercially available photonic devices are placed in sealed packages such as TO (transistor outline) metal cans or ceramic chip carriers. A transparent glass or plastic window is then positioned over the active area of the photonic device. The die is typically adhered to the carrier and electrically connected to traces on the carrier using wire bonding.

One issue that is fundamental to the design of any photonic device is the desire to (relatively) efficiently optically couple each active facet (i.e., emitter or detector) of the photonic device to its associated optical fiber. The coupled power on launch (lasing) must be enough to supply the complete link but not so high that laser safety is compromised. When photonic devices are packaged in metal cans or ceramic carriers, there is an inherent standoff distance between the optical fiber or fiber bundle and the active facets of the devices. Typical standoff distances in currently available packages tend to be in the range of 1–5 mm depending upon the type of packaged used. At these distances, it becomes important to collimate the optical fibers to insure good optical coupling between the fibers and the photonic elements. Typically collimation is accomplished by providing a simple lens at the termination of the optical fiber.

One approach to maintaining a close coupling between the photonic device and the optical fiber is to control the standoff distance between the two components. This can be done, by placing a spacer on the base that supports the photonic device. Although the use of a spacer has significant appeal (and indeed the approach can be used with success), there are some practical drawbacks to this approach. Most notably, it can be difficult to provide precise quality control of the standoff distance. More specifically, when an integrated circuit wafer is fabricated, it will have a designated nominal thickness. However, as a practical matter there tend to be thickness variations between different photonic wafers, which results in thickness variations in their respective dice. One cause for the thickness variations stems from the fact that photonic wafers are typically background to a desired thickness. However, the typical grinding process is accurate only to within about 0.5 mil (13 microns) of the targeted thickness. Thus, different wafers may have different thickness, and mixing dice from these wafers will potentially impact the ability to accurately obtain the desired fiber standoff. Therefore, in a transceiver configuration, detector and laser dice must be pre-measured for thickness pairing. Similarly, when a spacer is fabricated, there are spacer production tolerances as well (although the spacer production tolerances tend to vary less than the wafer thickness). If the die thickness varies too much, there may be production problems using a spacer to provide the desired standoff between the die and optical fiber. For example, if the die is too thin relative to the spacer, then the gap between the fiber and the active facet may be farther than desired which reduces optical coupling. Alternatively, if the die is too thick relative to the spacer, then the gap is too small which may result in mechanical damage during the assembly process. One approach to addressing these tolerance problems is to sort and match the dice and spacers to provide the desired standoff. However, such an approach is less than optimum.

Another well known issue that arises in packaging optoelectronic devices relates to interference caused by back reflection. More specifically, light reflecting back off one of the interface components (e.g., a window, the optical fiber tip, or the photonic device) may interfere with the optical coupling and/or create optical interference. One approach to ameliorating these effects is to chamfer a portion of the distal tip of the optical fiber. This often also involves chamfering a portion of the fiber termination that supports the optical fiber as well. Although such grinding does tend to improve performance, it is an expensive and difficult step in the manufacturing process.

Although the described packaging techniques work well, they are relatively expensive to produce. Accordingly, there are continuing efforts to provide improved optical component packaging techniques that help reduce the size and costs of the optical components.

SUMMARY OF THE INVENTION

To achieve the foregoing and other objects and in accordance with the purpose of the present invention, an optoelectronic component is described that includes a photonic device carried by a substrate. A support structure having a relatively higher portion and a relatively lower portion is formed on or attached to the substrate. In a preferred embodiment, the support structure is a dam structure formed by dispensing a flowable material onto the substrate and hardening the dispensed material. However, spacer stacks or a variety of other devices may be used to form the support structure in alternative embodiments. The optoelectronic component further includes one or more optical fibers, with each optical fiber being in optical communication with an active facet on the photonic device. The relatively higher and lower portions of the support structure are arranged to position the optical fiber(s) at a desired standoff distance from the photonic device and to slightly incline the distal tip of the optical fiber relative to the top surface of the photonic device.

The described packaging approach can be used in both single fiber and multi-channel devices. In some specific embodiments, the support structure is arranged to engage a fiber termination that holds the optical fiber(s). In other embodiments the support structure directly contacts a cladding portion of the optical fiber.

An optically clear cap may also be provided to cover the active facet of the photonic device. In embodiments where the support structure surrounds the photonic device, the support structure may be used as a containment for the cap. With this arrangement, a flowable clear topping material is dispensed over the photonic device without requiring a traditional molding operation. The cap may be formed from any suitable optically clear material. By way of example, optically clear epoxy works well.

The dam structure may also be formed from a variety of materials. One preferred approach is to dispense and cure an epoxy based material. When desirable, the dam structure may be formed from a plurality of independently dispensed dams.

In some specific embodiments, the substrate takes the form of a flexible material having electrically conductive traces thereon that are electrically connected to the photonic device. In these embodiments, an optical component support block may be provided to support the flex material. In other implementations, the base substrate may be a ceramic form printed with electrically conductive traces. In some implementations, a semiconductor die that drives the photonic device may be directly soldered to the traces on the flexible material.

BRIEF DESCRIPTION OF THE DRAWINGS

The invention, together with further objects and advantages thereof, may best be understood by reference to the following description taken in conjunction with the accompanying drawings in which:

FIGS. 5(a)–5(f) are diagrammatic side and top views illustrating various intermediate steps in the preparation of the packaged optoelectronic component illustrated in FIG. 1.

DESCRIPTION OF THE INVENTION

As suggested in the background, in optoelectronic devices, it is generally perceived as desirable to provide a close coupling between the optical transmission line (e.g. optical fiber) and the active facet of a photonic device that optically communicates with the optical fiber, thereby systematically optimizing coupling power within safety constraints. It is generally known that if the optical fiber can be held close enough to the active facet, it is possible to eliminate the need for a collimating lens altogether. However achieving such close coupling in an economical manner has posed some difficulties. The drawings and the description below illustrate a packaging approach that can help facilitate close optical coupling between photonic devices and their associated fibers.

Figure 1:
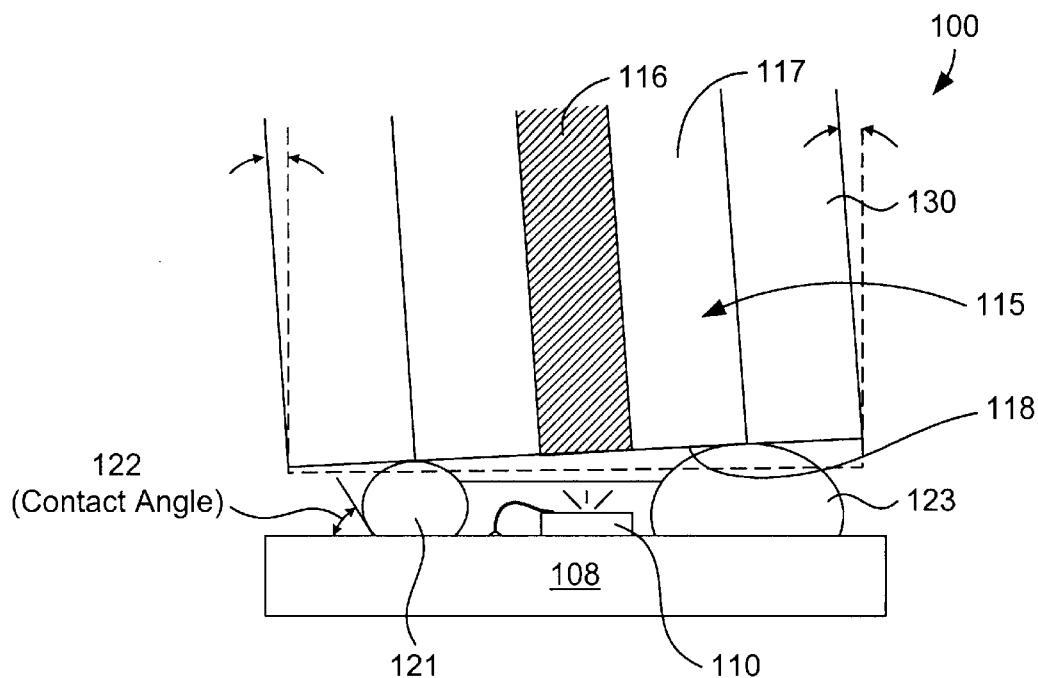
FIG. 1 is a diagrammatic cross sectional side view of the optical interface region of a optoelectronic component in accordance with one embodiment of the invention.
Figure 2:
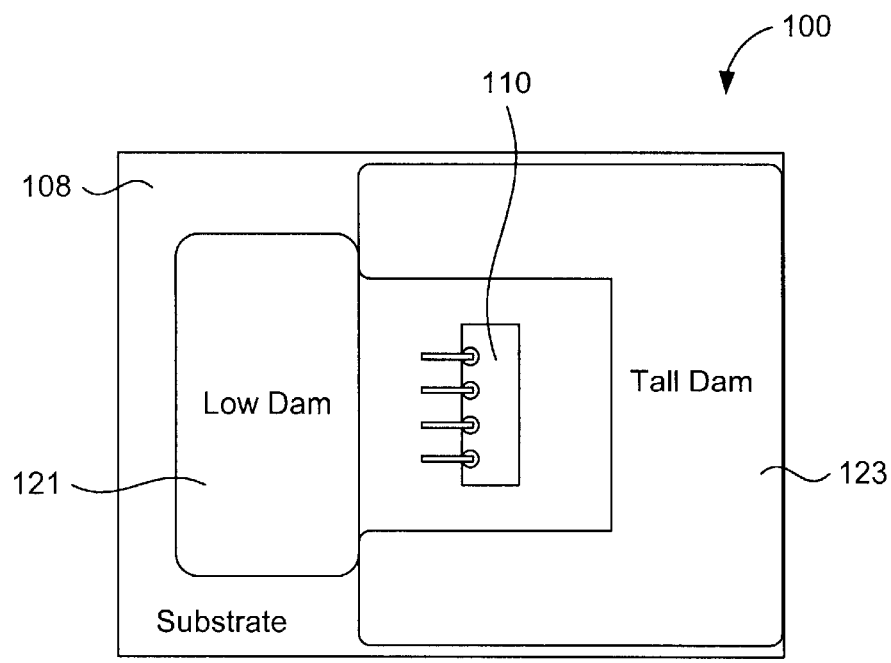
FIG. 2 is a top view of the optical interface shown in FIG. 1 illustrating the footprint of the dam structure.

Referring next to FIGS. 1 and 2, the optical interface region 100 of an optoelectronic package formed in accordance with one embodiment of the invention will be described. In the illustrated embodiment, a photonic device die 110 is mounted and electrically connected to a substrate 108 such that the active facets (active regions) of the photonic device 110 are exposed outward toward their associated optical fibers 115. A dam structure 120, composed of at least two dam sections 121 and 123 is formed on the substrate to serve as a registration surface for the optical fiber. Dam section 121 is a relatively lower dam and is located on a first side of the die 110 while dam section 123 stands relatively higher and is located on the opposite side of the die. An optically clear cap 140 that is bounded by the dam structure 120, serves to encapsulate over the photonic device 110.

During assembly, a fiber termination 130 that support the optical fibers 115 is positioned over the photonic device such that one side of the fiber termination contacts the lower dam 121 while the other side of the fiber termination contacts the higher dam 123. This causes the optical fibers 115 (and particularly the distal tips 118 of the optical fibers) to be angled with respect to the top surface of the photonic device 110. The angle formed between an optical fiber tip 118 and its associated facet on the photonic device 110 has an optical effect that has the same benefits as the chamfering of the distal tip of the optical fiber described in the background section. It should be apparent that the relative angle of inclination between the optical fiber and the photonic device can be easily controlled by appropriate selection of the relative dam heights in relation to their spacing. Essentially any desired angle can be formed. By way of example, angles in the range of 6 to 9 degrees are believed to be typical.

The dams 121 and 123 are formed by dispensing precise volumes of a hardenable liquid or low viscosity material. As will be appreciated by those familiar with precision dispensing, with the proper selection of materials, the surface tension of the dispensed fluid can be relied upon to cause the dispensed material to assume a very predictable shape (including height) based upon the volume of fluid dispensed. Thus, the height of the dams can be accurately controlled by precisely controlling the volume of the fluid dispensed. A wide variety of micro-dispensers that are well suited for such precision dispensing are commercially available.

It should be appreciated that the dam structure 120 also serves to define the standoff distance between the optical fiber core and the active facets of the photonic device. As described above in the background discussion of the use of spacers to control the optical fiber standoff height, variations in the thickness of the die can make it somewhat difficult to precisely control the standoff height in real production environments. With the dam dispensing approach just described, these variations can be largely compensated for by simply measuring the actual thickness of the die or the height of the top surface of the die relative to the substrate 108. The desired height of the dams 121 and 123 can then be determined and the appropriate volumes of the fluid material dispensed can be precisely controlled to achieve the desired dam height. Thus, the standoff height can be very precisely controlled by effectively building dams that are sized appropriately for the specific application. For the most precise control, the actual height of the top surface of the die 110 relative to the substrate 108 can be dynamically measured during assembly of each optoelectronic package. Alternatively, if the height of a batch of dice is known to be the same, it may be possible to select the appropriate dam volumes for the batch without necessarily measuring every unit. However, with the use of automatic auto-focusing vision systems, the dynamic measurement of the mounted die height can easily be made and is therefore preferred. More specifically, the vision system can be programmed to automatically focus on a reference (a.k.a. fiducial point) on the base substrate and refocus on a fiducial point on the photonic device. The effective thickness of the die and the adhesive used to attach the die can be automatically determined using these measurements. The use of dam structures in general to control optical fiber standoff distances is described in some detail in concurrently filed, copending application Ser. No. 09/922,357 which is incorporated herein by reference.

The term "dam" structure has been used to refer to the dispensed and hardened structure that serves as the registration surface for the fiber termination or the optical fiber itself. The shape and composition of the dam structure may be widely varied. In the illustrated embodiment, the dam structure is composed of a pair of independently dispensed dams that completely surround the photonic device 110. The lower dam 121 is somewhat rectangular shaped and is located to one side of the photonic device. The higher dam 123 is substantially U-shaped and surrounds the other three sides of the photonic device 119 with its open end contacting the lower dam. Of course in alternative embodiments, the lower dam may be U-shaped, the dam structure can be composed of additional dams or a wide variety of other dam geometries may be used. More specifically, the dam structures may be formed in any geometry that can be accurately dispensed. If there is sufficient control of the dispensing, it would be possible (and indeed likely desirable) to dispense the entire dam structure in a single pass. In the illustrated embodiments, the dam structure completely surrounds the die. This has the advantage of facilitating the simple encapsulation of the photonic device. However, this is not a requirement in all systems. Rather, opposing dam segments that are located on opposite sides of the photonic device could readily provide the desired standoff and angling. Such dam segments can also take any suitable shape and they need not be the same shape. For example, these might include elongated linear dams, arc shaped dams, substantially ball or drop shaped dams and other dam geometries.

In the embodiments described, the dam structures are used to position the fiber termination (or ferrule). However, in some alternative embodiments, different sized spacers could be used in place of the described dam structures. Also, depending on the relative sizes of the die and the optical fibers, some portions of the dam structure may be positioned at a location that engages the cladding of the optical fiber 115 itself as opposed to a ferrule or termination that holds the fiber(s). In other embodiments, the dams can be arranged to engage both the fiber termination and the cladding. Generally it is desirable to insure that the dam does not cover any portion of the core of the optical fiber since that would interfere with the optical coupling between the optical fiber 115 and the photonic device 110.

The substrate 108 has conductive traces (not shown) thereon. The photonic device may be electrically coupled to the conductive traces by any suitable connection technique. In the embodiment shown the photonic device has a common cathode that is located on the back surface of the die. This common cathode is directly soldered to its associated conductive trace. Bonding wires 128 are used to electrically couple the anodes of the respective active regions (which are located on the top surface of the die) to their associated conductive traces. However, it should be appreciated that a wide variety of other suitable connection techniques, including (but not limited to) TAB, direct soldering (e.g. "flip chip" type mounting), and even conventional package mounting techniques (e.g. soldering, pins, etc.) can readily be used in particular implementations. It should be appreciated that it is generally desirable to bring the optical fiber as close as practical to the active facet of the photonic device without causing damage. When wire bonding is used, the loop height of the bonding wires may interfere with this approach. In order to help reduce the loop height of the bonding wire, a reverse wire bond may optionally be used. In this approach the bonding wires 128 are ball bonded to the substrate and stitch bonded to bond pads on the photonic device (or to conductive bumps formed on the bond pads).

A variety of materials can be used as the hardenable dam material. By way of example, epoxy and epoxy like materials work particularly well and are commonly used in semiconductor packaging. Alternatively, silicone gel or a variety of other materials may be used to form the dam. The specific materials used to form the dam may be widely varied based on a variety of factors including the nature of the substrate used. In order to provide the best results, material selection and compatibility is quite important. Generally, a very small contact angle 122 (which is indicative of good wetting) between the substrate and the dam material is undesirable since the resin may flow uncontrollably. Very high contact angles, (which is indicative of relatively poor wetting) may also have problems since they tend to be indicative of worse adhesive strength which may present long-term reliability issues. By way of example, contact angles in the range of 30 to 60 degrees are currently perceived to be preferable since they tend to balance dam geometry control and adhesion. However, when different materials are used, contact angles outside that range may well work fine.

In the illustrated embodiment, the distal tip of the optical fiber is a flat surface. As discussed in the background, in some conventional applications a portion of the distal tip of the optical fiber is chamfered (typically together with the fiber termination). The ability to slightly tilt the termination and thus the optical fibers relative to the photonic device provides substantially the same benefits as the chamfering using a significantly easier and cheaper approach.

Figure 3:
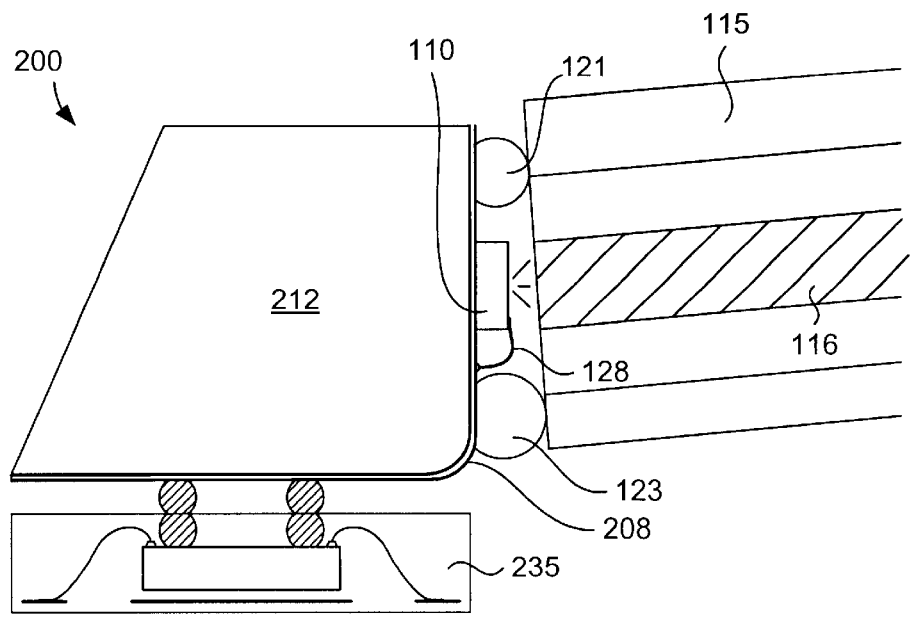
FIG. 3 is a diagrammatic cross sectional side view of a packaged optoelectronic component in accordance with another embodiment of the invention.

Referring next to FIG. 3, an optoelectronic package 200 in accordance with another embodiment of the invention will be described. In the illustrated embodiment, a flexible substrate material 208 having conductive traces (not shown) thereon is supported by an optical base 212. This structure is described in more detail in co-pending application Ser. No. 10/165,553, which is incorporated herein by reference. By way of example, the flexible substrate can take the form of conventional flex printed circuit cabling. A photonic device (die) 110 is mounted and electrically connected to the flexible substrate 208 such that the facets (active regions) of the photonic device are exposed outward towards the optical fibers 115. The optical interface region 105 in this embodiment may take a form similar to the interface region 105 illustrated in FIG. 1 & 2. In this example, the anodes and cathodes on the die are electrically coupled to one end of the flexible substrate. The flexible substrate is wrapped around one corner of the optical base 212 and is electrically coupled to a separate chip 235 that includes suitable circuitry (i.e., receiver, transmitter or transceiver circuitry) to drive the photonic device 110. Of course, the design and packaging of the integrated circuit 235 may be widely varied. In the illustrated embodiment, the integrated circuit 235 is packaged in a leadless leadframe package (LLP) format that includes contacts on a top surface that are electrically coupled to the flexible substrate. The bottom surface of the package has standard LLP contacts. These structures are described in more detail in co-pending application Ser. Nos. 09/922,358 and 09/947,210, each of which are incorporated herein by reference. The entire optoelectronic component can be further packaged within a sleeve of the nature described in co-pending application Ser. No. 09/713,367 filed Nov. 14, 2000, which is also incorporated herein by reference. In other embodiments, a ceramic substrainted circuitry formed thereon may be used as the base substrate.

In the embodiment shown, the photonic device has eight facets. It should be apparent that the described dam structure can readily be used to position any suitable number of optical fibers relative to their respective active regions on the photonic device. For example, the described arrangement works well with single fiber devices, transceivers with independent inputs and output fibers, and multi-channel receiver, transmitter or transceiver devices. In some embodiments, multiple photonic devices may be placed on the same structure and the dam structures can be modified appropriately as necessary. The dam structures can be readily designed to facilitate glob encapsulation of the devices individually or together.

In the embodiments illustrated in FIG. 1, a single photonic device is provided. By way of example, referring next to FIG. 4 an optoelectronic transceiver in accordance with another embodiment of the invention will be described. In this embodiment, the optical transceiver includes a multi-channel (in the illustrated embodiment a four channel) photonic transmitter device 250 and a multi-channel (again a four channel) photonic detector device 260. Each of the transmitter and detector devices 250, 260 have an associated array of four optical fibers. The standoff distances between the emitters 252 or photodetectors 262 and their respective optical fibers can be controlled by forming a plurality of dams as described above with respect to FIGS. 1 and 2.

Figure 4:
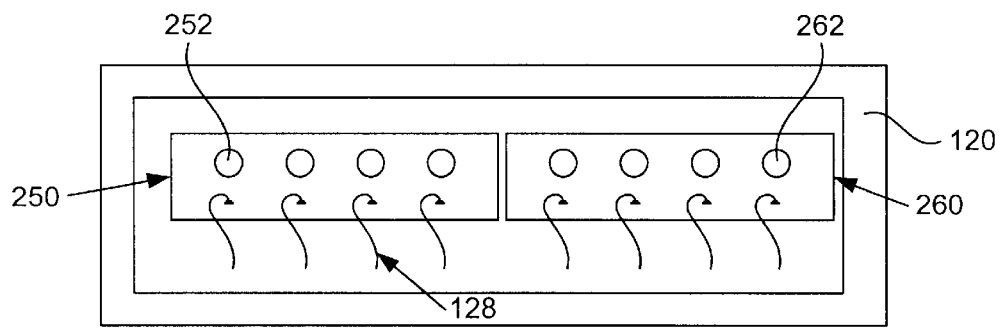
FIG. 4 is a diagrammatic top view of the optical interface region of a four channel multimode transceiver having a first photonic device with an array of four emitters and a second photonic device with an array of four detector ports.
Figure 6:
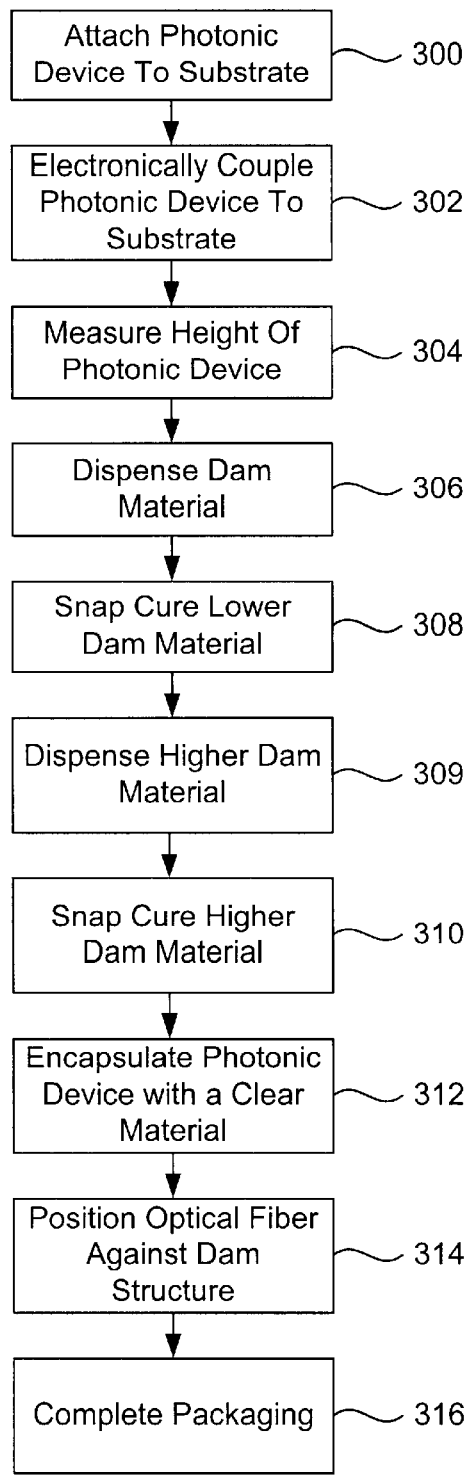
FIG. 6 is a flow chart illustrating a method of forming a dam structure in accordance with one embodiment of the present invention.

The illustrated transmitter device 250 has an array of four emitters 252 together with the drive circuitry required to drive the emitters to emit optical signals onto their associated optical fibers (not shown). The receiver device 260 has an array of four photodetectors 262 and the drive circuitry required to receive signals from their associated optical fibers (not shown). Of course, the number of emitters and/or detectors on a particular device can be widely varied to meet the needs of a particular application. In many multi-channel applications, it is desirable to separate the emitters from the detectors in different chips as illustrated in FIG. 4. This is primarily due to the nature of electrical cross talk between the transmitter and detector circuitry. However, integrated transceivers can readily be provided as well.

The described optoelectronic packages can be assembled in a wide variety of manners. By way of example, one suitable method will be described with reference to FIGS. 5(a)–5(d) and 6. In the aspect relative to the present invention, the die is attached to a suitable substrate in step 300. The substrate can take any suitable form. In most cases, the substrate will have conductive elements thereon to facilitate electrically coupling the photonic device to other components or devices either inside or outside of the package. Any conventional die attachment arrangement can be utilized. In many situations, an adhesive is used to secure the die to the substrate. However, in the described embodiment, a common cathode is provided on the back surface of the photonic device 110. Therefore, the photonic device is soldered to a conductive cathode trace on the substrate. After the photonic device has been attached to the substrate, the anodes may be electrically connected in any conventional manner. Step 302. Of course, if the cathode is located on the top surface of the photonic device, it would need to be electrically connected as well. Today, wire bonding remains the most popular connection approach, although other approaches may be used as well.

If the photonic device has its active facets on one side and all of its electrical contacts on the other side, then the device may be flip chip mounted or a grid array package may be used to both mechanically and electrically couple the photonic device 110 to the substrate 108.

At some point after the die has been secured to the substrate, the height of the die 110 or its active facets may be measured relative to the substrate as represented by step 304. In the described embodiment, the height is measured after the photonic device has been electrically connected to the substrate. However, this is not a requirement. Although measuring the height of the die relative to the die is preferably done after the die is mounted, it should be appreciated that in most situations, the most significant variable will be the wafer thickness (as opposed to height variations due to soldering or adhesive bonding). Thus, in some embodiments it may be desirable to measure the die or wafer height prior to bonding in order to simplify the procedure.

Once the die height is known, the high and low desired dam heights and thus the appropriate volumes to dispense can readily be calculated and the dam material dispensed. Step 306. In the illustrated embodiment, the lower dam 121 is formed first on the substrate 108 as illustrated in FIGS. 5(a) and 5(b). The actual geometry of the lower dam and its spacing relative to the photonic device may be widely varied based on the needs of a particular device. In the illustrated embodiment, a single elongated rectangular shaped dam is provided as the lower dam. However, in alternative embodiments, other specially shaped dams may be dispensed. In the embodiment shown, the lower dam 121 is on the side opposite the bonding wires 128. In some situations this may have the advantage of permitting closer coupling of the optical fibers to the photonic device. However, in alternative embodiments the lower dam may be located on the same side as the bonding wires. Of course, in alternative implementations of the die, the bond pads may not be aligned with the facets and the electrical connectors would be positioned accordingly.

After the lower dam 121 has been dispensed, it may be set using an appropriate technique such as snap curing. Step 308. The nature of the setting will depend on the material used. In the described embodiment, an epoxy resin is used as the dam material. As will be appreciated by those familiar with semiconductor packaging, UV light or heat are typically used to quickly cure (e.g. snap cure) epoxy materials in semiconductor applications.

After the lower dam 121 has been set, the higher dam 123 may be dispensed and set in the same manner. Steps 309, 310. As seen in FIG. 5(d), the higher dam 123 extends on three sides of the photonic device 110. The most important section of the higher dam 123 is the segment positioned opposite the lower dam 123 as seen in FIG. 5(c). It should be appreciated that when the fiber termination is brought into contact with the higher and lower dam structures, it will be inclined relative to the top surface of the photonic device 110. When the photonic device has an array of facets, the lower and upper dams are positioned on opposite sides of the array as shown in FIGS. 5(c) and 5(d) such that standoff between the respective optic fibers and their associated active facets on the photonic device 110 will be the same.

After the higher dam 123 has been dispensed in step 309, it may be snap cured or otherwise set in the same manner as the lower dam 121. Step 310. Of course, if other dam structures are used, other intermediate steps may be required. A variety of commercially available microdispensers can be used to dispense the dam material. If the dispensers have sufficient control, it may eventually be possible to dispense and cure the entire dam structure in a single pass.

After the entire dam is set, a transparent material is dispensed into the region circumscribed by the dam structure 120 in order to form a cap 140 that protect the photonic device 110. This step 312 is best illustrated in FIGS. 5(e) and 5(f). A variety of optically clear materials can be used to form the cap. In the described embodiment, an optically clear epoxy gel is used. After the cap has been dispensed it may be snap cured as well by exposure to either heat or UV light. Of course, if other materials are used to form the cap, other mechanisms may be used to set the encapsulating material. The advantage of providing the described cap is that it helps protect the photonic device from damage and/or contamination during subsequent handling and/or usage of the optoelectronic component. It should be appreciated that having a dam structure 120 that circumscribes the photonic device makes it particularly easy to form the dam. That is, a good quality cap can be formed from a simple dispensing operation as opposed to a separate molding operation which takes considerably more effort. In the embodiment shown, the cap does not reach as high as the top surface of the lower dam 121. However, in some implementations it is contemplated that the cap would be substantially the same height as the lower dam structure. It should be appreciated that the optically clear cap can be eliminated in some embodiments, although the environumental protection of such devices would not be as good.

After the cap 140 has been formed, a fiber termination that carries an array of optical fibers is positioned relative to the photonic device 110 such that the dams act as a registration surface for the fiber termination. Step 314. More specifically, one side of the fiber termination contacts the lower dam 121 while the other side of the fiber termination contacts the higher dam 123. This causes the optical fibers 115 (and particularly the distal tips 118 of the optical fibers) to be angled with respect to the top surface of the photonic device 110. The angle formed between an optical fiber tip 118 and its associated facet on the photonic device 110 has an optical effect that has the same benefits as the chamfering of the distal tip of the optical fiber described in the background section. It should be apparent that the relative angle of inclination between the optical fiber and the photonic device can be easily controlled by appropriate selection of the relative dam heights in relation to their spacing. Essentially any desired angle can be formed. By way of example, angles in the range of 6 to 9 degrees are believed to be typical. In some embodiments, the cladding portion of the optical fiber itself will be brought into registration with the dam. However, in many applications (and particularly devices which have multiple channels) it is common to provide a fiber array termination or a ferrule at the end of the optical fibers to facilitate handling. In these applications, it will generally be preferable (although not required) to have the fiber termination register against the dam 120.

After the optical fibers have been positioned, the remainder of the packaging and testing may be completed in a conventional manner. Step 316. The actual steps employed may vary widely based on the particular system being packaged. Of course, in many applications additional preparatory and/or intermediate steps will be performed during the assembly of a particular package. Additionally, although the described method has been described in a sequential manner, it should be appreciated that in many instances, the order of the various steps can be varied and some of the described steps combined or eliminated.

Although only a few embodiments of the present invention have been described in detail, it should be understood that the present invention may be embodied in many other specific forms without departing from the spirit or scope of the invention. Particularly, it should be apparent that the described dam structures can readily be applied to a wide variety of photonic devices to provide a precise, angled standoff for their associated optical fibers. The geometry, position and size of the dispensed dam may readily be adjusted to meet the needs of a particular application.

The invention has been described primarily in the context of using dispensed dams of different heights to angle the optical fibers relative to the photonic device. However, in other implementations spacers could be used in place of the dam structures and/or a combination of dispensed dam structures and fixed spacers could be used. Further, in the illustrated embodiments, end walls are provides such that the dam structure is arranged to circumscribe the photonic device. However, this is not by any means a requirement. Open dam structures can be used in a wide variety of applications and particularly in systems that to not contemplate encapsulating the photonic device.

The described dams can readily be applied to both single channel devices and multi-channel devices. They can be used to register free fiber tips, or to register a fiber termination such as a fiber array termination or a ferrule. Therefore, the present examples are to be considered as illustrative and not restrictive, and the invention is not to be limited to the details given herein, but may be modified within the scope of the appended claims.

What is claimed is:

1. An optoelectronic package comprising:

a substrate;

a photonic device carried by the substrate, the photonic device having a top surface that includes an active facet thereon;

an optical support structure attached to the substrate, the optical support structure having a relatively higher portion and a relatively lower portion;

an optically clear cap that covers the active facet of the photonic device, the optically clear cap being contained by the optical support structure; and an optical fiber in optical communication with the active facet on the photonic device, the optical fiber having a distal tip that is substantially perpendicular to a longitudinal axis of the optical fiber; and wherein the relatively higher and lower portions of the optical support structure are arranged to position the distal tip of the optical fiber at a desired standoff distance from the photonic device with a small angle of inclination relative to the top surface of the photonic device.

2. An optoelectronic package as recited in claim 1 wherein the optical support structure is a dam structure formed by dispensing a flowable material onto the substrate and hardening the dispensed material, the dam structure having the relatively higher portion and the relatively lower portion.

3. An optoelectronic package as recited in claim 1 wherein the optical support structure is formed by spacers.

4. An optoelectronic package as recited in claim 2 wherein the optically clear cap is formed by dispensing a flowable clear material over the photonic device such that it is contained by the dam structure and hardening the flowable clear material.

5. An optoelectronic package as recited in claim 1 wherein the optical support structure directly contacts a cladding portion of the optical fiber.

6. An optoelectronic package as recited in claim 1 wherein the optical support structure directly contacts a fiber termination that is attached to the optical fiber.

7. An optoelectronic package as recited in claim 2 wherein the dam structure is formed from a plurality of dams.

8. An optoelectronic package as recited in claim 2 wherein the dam structure is formed by dispensing and curing an epoxy based material.

9. An optoelectronic package as recited in claim 1 wherein the substrate has electrically conductive traces thereon that are electrically connected to the photonic device, the optoelectronic package further comprising a semiconductor die in electrical communication with the photonic device through the conductive traces.

10. An optoelectronic package as recited in claim 9 wherein the substrate is formed from a flex material and the die is directly soldered to the substrate, the optoelectronic package further comprising an optical component support block that supports the flex material.

11. An optoelectronic package as recited in claim 6 further comprising a plurality of optical fibers and wherein:
the photonic device has a plurality of facets, each facet being associated with an individual optical fiber; and
the fiber termination holds the plurality of optical fibers.

12. An optoelectronic package as recited in claim 4 wherein the cap is formed from an epoxy material.

13. An optoelectronic package comprising:
a substrate;
a photonic device carried by the substrate, the photonic device having a top surface that includes a plurality of active facets thereon;
a dam structure formed by dispensing a flowable material onto the substrate and hardening the dispensed material, the dam structure having a relatively higher portion and the relatively lower portion;
a plurality of optical fibers, each optical fiber being in optical communication with an associated one of the active facets on the photonic device, the optical fibers each having a longitudinal axis and a distal tip that is substantially perpendicular to the longitudinal axis;
a fiber termination that holds the plurality of optical fibers; and
wherein the relatively higher and lower portions of the optical support structure are arranged to engage the fiber termination to position the distal tips of the optical fibers at a desired standoff distance from the photonic device and to incline the distal tips of the optical fibers a designated small angle relative to the top surface of the photonic device.

14. An optoelectronic package as recited in claim 13 wherein the optically clear cap that covers the active facets of the photonic device is formed by dispensing a flowable clear material over the photonic device such that it is contained by the dam structure and hardening the flowable clear material.

15. An optoelectronic package as recited in claim 14 wherein the dam structure is formed from a plurality of dams.

16. An optoelectronic package as recited in claim 14 wherein the dam structure is formed by dispensing and curing an epoxy based material.

17. An optoelectronic package as recited in claim 14 wherein the cap is formed from an epoxy material.

18. An optoelectronic package comprising:
a substrate formed from a flex material having electrically conductive traces thereon;
an optical component support block that supports the flex material;
a photonic device carried by the substrate, the photonic device having a top surface that includes a plurality of active facets thereon;
a semiconductor die carried by the substrate, the semiconductor die being in electrical communication with the photonic device through the conductive traces;
a dam structure formed by dispensing a flowable material onto the substrate and hardening the dispensed material, the dam structure having a relatively higher portion and the relatively lower portion;
an optically clear cap that covers the active facets of the photonic device, the cap being contained by the dam structure;
a plurality of optical fibers, each optical fiber being in optical communication with an associated one of the active facets on the photonic device, the optical fibers each having a longitudinal axis and a distal tip that is substantially perpendicular to the longitudinal axis;
a fiber termination that holds the plurality of optical fibers; and
wherein the relatively higher and lower portions of the optical support structure are arranged engage the fiber termination to position the distal tips of the optical fibers at a desired standoff distance from the photonic device with a designated small angle of inclination formed between the top surface of the photonic device and the distal tips of the optical fibers.

19. An optoelectronic package as recited in claim 18 wherein the dam structure is formed from a plurality of dams, the dams being formed by dispensing and curing an epoxy based material.

20. An optoelectronic package as recited in claim 18 wherein the cap is formed from an epoxy material.

21. A method of packaging an optoelectronic device comprising:
attaching a photonic device directly or indirectly to a substrate;
forming a dam structure having relatively higher and relatively lower sections on the substrate by dispensing accurate volumes of a flowable material on the base substrate and hardening the dispensed material to form the dam structures;
dispensing an optically clear cap in a region bounded by the dam structure to cover the active facets of the photonic device; and
positioning a fiber termination that carries at least one optical fiber over the photonic device such that the relatively higher and lower portions of the optical support structure engage the fiber termination to position the optical fibers at a desired standoff distance from the photonic device with a small angle of inclination formed between a top surface of the photonic device and a distal tip of each optical fiber.

22. A method as recited in claim 21 wherein the dispensed optical material is selected from the group consisting of an epoxy, an epoxy like material and a silicone gel.

23. A method as recited in claim 22 further comprising electrically connecting the photonic device to substrate by wire bonding and wherein:

the height of the dam structure is sufficiently high to prevent the optical fiber from contacting a bonding wire formed by the wire bonding; and the cap encapsulates the bonding wire.

24. A method as recited in claim 21 wherein forming the dam structure comprises forming a plurality of dams, wherein a first dam forms the relatively lower portion of the dam structure and a second dam forms the relatively higher portion of the dam structure.

25. A method as recited in claim 21 wherein the dispensed flowable material is an epoxy based material and the hardening is accomplished by curing the epoxy based material.

\* \* \* \* \*

UNITED STATES PATENT AND TRADEMARK OFFICE
CERTIFICATE OF CORRECTION

PATENT NO. : 6,595,699 B1
DATED : July 22, 2003
INVENTOR(S) : Nguyen et al.

It is certified that error appears in the above-identified patent and that said Letters Patent is hereby corrected as shown below:

Column 7,
Line 15, change "substrainted" to -- substrate having printed --.

Column 9,
Line 39, change "environumental" to -- environmental --.

Signed and Sealed this

Twenty-second Day of June, 2004

JON W. DUDAS
*Acting Director of the United States Patent and Trademark Office*